United States Patent
Zhang et al.

(10) Patent No.: US 11,145,635 B2
(45) Date of Patent: Oct. 12, 2021

(54) LED DISPLAY UNIT

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Yongfeng Guo, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 70 days.

(21) Appl. No.: 16/631,833

(22) PCT Filed: Nov. 23, 2018

(86) PCT No.: PCT/CN2018/117253
§ 371 (c)(1),
(2) Date: Jan. 16, 2020

(87) PCT Pub. No.: WO2020/103143
PCT Pub. Date: May 28, 2020

(65) Prior Publication Data
US 2021/0225818 A1     Jul. 22, 2021

(51) Int. Cl.
*H01L 25/13* (2006.01)
*H01L 23/32* (2006.01)

(52) U.S. Cl.
CPC .............. *H01L 25/13* (2013.01); *H01L 23/32* (2013.01)

(58) Field of Classification Search
CPC ................ H05K 5/0017; H05K 5/0086; H01L 51/5237; H01L 27/3262; G09F 9/301;
(Continued)

(56) References Cited

U.S. PATENT DOCUMENTS

| 9,671,530 B2 | 6/2017 | Kwon et al. | |
| 2012/0106101 A1* | 5/2012 | Kim | H04M 1/00 361/749 |

(Continued)

FOREIGN PATENT DOCUMENTS

| CN | 102829305 A | 12/2012 |
| CN | 203799594 U | 8/2014 |
| CN | 107833523 A | 3/2018 |

OTHER PUBLICATIONS

Search report of counterpart European Patent Application No. 18923760.5 dated May 28, 2021.

*Primary Examiner* — Dung A. Le (57) ABSTRACT

Provided is an LED display unit, comprising a front body, a lamp plate and a rear body, wherein the lamp plate is bendable and flexible, and the rear body comprises a plurality of rear body units, the front body is covered on one side of the lamp plate provided with LED lamps, each rear body unit is fixedly connected to a side of the lamp plate facing away from the LED lamps, and adjacent rear body units are arranged at intervals; by adopting the bendable and flexible lamp plate, every single LED display unit can be directly adjusted into a curved surface or any curved surface shape; a plurality of rear body units are fixed on the lamp plate, and gaps exist between the rear body units, which is beneficial to releasing bending stress and preventing the rear body from breaking during bending.

14 Claims, 7 Drawing Sheets

(58) Field of Classification Search
CPC . G06F 1/1616; H01F 1/14708; H01F 1/14791
See application file for complete search history.

(56) References Cited

U.S. PATENT DOCUMENTS

| | | | |
|---|---|---|---|
| 2015/0062927 A1* | 3/2015 | Hirakata | G09F 9/301 362/362 |
| 2016/0212864 A1 | 7/2016 | Lee et al. | |
| 2017/0094813 A1* | 3/2017 | Taniguchi | H05K 5/0017 |

* cited by examiner

LED DISPLAY UNIT

TECHNICAL FIELD

The application belongs to the technical field of LED display screens, in particular to an LED display unit.

BACKGROUND

With the development of science and technology, LED display screen has the advantages of high brightness, low working voltage, low power consumption, large size, long service life, impact resistance and stable performance, and is widely used in people's production and life. The development prospect of LED display screen is extremely broad, and it is developing towards higher brightness, higher weather resistance, higher luminous density, higher luminance uniformity, higher reliability and full color. LED display screens are widely used in sports venues, commercial applications, banks, securities, postal services, docks, shopping malls, railway stations, telecommunications, agencies, monitoring, schools, restaurants, hotels, entertainment, and other outdoor places for advertising.

At present, another development direction of LED display screen is large-sized display screen, such as outdoor advertisement, large scene display, LED display tiles or large screen game interfaces. Large screen displays are usually spliced by a plurality of display devices through light boxes to form large screens or super large screens. At present, the whole screen of the LED large-screen display is spliced by a plurality of LED boxes. In the splicing process, traction and hoisting equipment are needed to complete the splicing. In addition, after the splicing is completed, construction personnels need to perform complicated wiring, power connection and line connection work behind the display screen. The overall process is complex and prone to errors.

Currently, spliced LED large-screen displays usually focus on seamless splicing, the convenience and stability of splicing and installation. In other words, the existing spliced LED large-screen displays are basically planar, there are few large curved screens. In the prior art, the few large curved screens usually realize curved surface effects by setting splicing angles of LED lamp boxes with multiple planes. This curved surface effect is not a real curved surface. Their LED light boxes still adopt the traditional box structure and do not actually realize curved surface design.

Technical Problem

The technical problem to be solved by the application is: the existing LED display screen adopts a traditional planar LED display unit structure, can only realize curved LED display screen by adjusting the splicing angle of each LED display unit, and does not actually realize curved design. Thus, an LED display unit capable of realizing any curved surface is provided.

Technical Solution

The technical solution adopted by the application for solving the above technical problems is as follows: An LED display unit is provided, comprising a front body, a lamp plate and a rear body, wherein the lamp plate is bendable and flexible, the rear body comprises a plurality of rear body units, the front body is covered on one side of the lamp plate provided with LED lamps, each of the rear body units is fixedly connected to a side of the lamp plate facing away from the LED lamps, and adjacent rear body units are arranged at intervals.

The above LED display unit of the present application, further comprises an elastic stop piece for limiting the ultimate bending degree of the lamp plate, wherein the elastic stop piece is positioned between the lamp plate and the rear body.

In the LED display unit of the application, the elastic stop piece is set as a strip-shaped elastic piece; each of the rear body unit is equally spaced on the elastic stop piece.

In the LED display unit of the present application, the side of the lamp plate facing away from the LED lamps is provided with positioning posts, correspondingly, the rear body unit is provided with positioning holes;

the lamp plate and the rear body are fixedly connected through the matching of the positioning posts and positioning holes, or fasteners, the positioning holes and the positioning posts are matched to fixedly connect the lamp plate and the rear body.

In the LED display unit of the present application, the centers of the positioning posts are provided with internal threaded holes, the fasteners are connection screws, the connection screws pass through the positioning holes and are matched with the internal threaded holes to fixedly connect the lamp plate and the rear body.

In the LED display unit of the present application, the positioning holes are stepped holes, the threaded portion of the connection screw is matched with the small end of the stepped hole, and the head of the connection screw is positioned in the stepped hole.

In the LED display unit of the present application, the outer surfaces of the positioning posts are provided with external threads, the fasteners are nuts, the positioning posts pass through the positioning holes and are matched with the nuts to fixedly connect the lamp plate and the rear body.

In the LED display unit of the present application, the positioning holes are stepped holes, the threaded portion of the positioning post is matched with the small end of the stepped hole, and the nut is positioned in the stepped hole.

In the above LED display unit of the present application, the positioning post is set to be multiple and distributed in rows.

In the LED display unit of the present application, the positioning post is a cylinder, the end close to the lamp plate is a front end, and the other end is a rear end; the diameter of the front end is larger than the diameter of the rear end;

the elastic stop piece is provided with a plurality of first through holes corresponding to the rear ends, and the elastic stop piece is sleeved on the rear end through the first through hole.

In the above LED display unit of this application, the length of the first through hole is greater than the length of the rear end; when the LED display unit is bent, the positioning post slides along the first through hole.

In the above LED display unit of this application, the elastic stop piece is provided with a second through hole, and the stop block of the rear body is inserted into the second through hole; when the LED display unit is bent, the stop block slides along the second through hole, and when the stop block abuts the end of the second through hole in the sliding direction of the positioning post, the positioning post abuts against the end of the first through hole in the sliding direction of the positioning post, or the positioning post does not abut against the end of the first through hole in the sliding direction of the positioning post.

In the above LED display unit of this application, a plurality of the rear body units are divided into rear body unit B, rear body unit A for fixed connection with the box of the LED display screen and rear body unit C for fixed connection with the power box of the LED display screen, the rear body units A are located at the left and right ends of the rear body, the rear body unit C is located in the middle of the rear body, and the rear body units B are located between the rear body unit A and the rear body unit C.

In the above LED display unit of this application, the rear body unit C is provided with a third through hole, the lamp plate is correspondingly provided with a connector for connecting a power box, and the connector is inserted into the third through hole.

In the above LED display unit of this application, the side of the rear body unit connected to the other rear body unit is set as an inclined plane, and the inclined plane is inclined from one end of the rear body unit near the lamp plate to one end of the rear body unit facing away from the lamp plate.

Beneficial Effects

The LED display unit provided by the application has the beneficial effects that compared with the prior art, the LED display unit of the application adopts a flexible lamp plate, can directly adjust a single LED display unit to form a curved surface, can also arbitrarily adjust the curved surface shape, and the curved surface shape formed by a plurality of LED display units is more closely attached, and even can be assembled into a special-shaped curved surface; A plurality of rear body units are fixed on the lamp plate, and gaps exist between rearbody units, which is beneficial to releasing bending stress and preventing rearbody from breaking during bending.

In the figures:
1. Front body;
2. Lamp plate;
21. Positioning post; 211. Internal threaded hole; 212. Front end; 213. Rear end;
22. Connector;
3. Rear body;
31. Rear body unit; 31a. Rear body unit A; 31b. Rear body unit B; 31c. Rear body unit C;
311. Positioning hole; 312. Third through hole; 32. Stop block;
4. Elastic stop piece; 41. First through hole; 42. Second through hole;
5. Connection screw.

DESCRIPTION OF DISCLOSED EMBODIMENTS

In order to make the to-be-solved technical problems, technical solutions and beneficial effects of this application clearer, the application will be described in further detail below with reference to the drawings and embodiments. It should be understood that the specific embodiments described herein are only for the purpose of explaining this application and are not intended to limit this application.

As shown in FIGS. 1 to 7, an LED display unit provided by an embodiment of the present application includes a front body 1, a lamp plate 2 and a rear body 3, wherein the lamp plate 2 is bendable and flexible, the rear body 3 comprises a plurality of rear body units 31, the front body 1 is covered on one side of the lamp plate 2 provided with LED lamps, each of the rear body units 31 is fixedly connected to a side of the lamp plate 2 facing away from the LED lamps, and adjacent rear body units 31 are arranged at intervals.

According to the application, a bendable and flexible lamp plate is adopted, so that every single LED display unit can be directly adjusted into a curved surface and can be adjusted into any curved surface shape, and the curved surface shape formed by a plurality of LED display units is more closely attached, and even can be assembled into special-shaped curved surfaces; a plurality of rear body units 31 are fixed on the lamp plate 2, and gaps exist between the rear body units 31, which is beneficial to releasing bending stress and preventing the rear body 3 from breaking during bending.

Specifically, the lamp plate 2 comprises a PCB board, LED lamps and electronic components, wherein the LED lamps are positioned on one side of the PCB board, and the electronic components are welded on the side of the PCB board facing away from the LED lamps.

Specifically, the front body 1 is a mesh mask, which can protect LED lamps and prolong the service life of the lamp plate 2.

Figure 2:
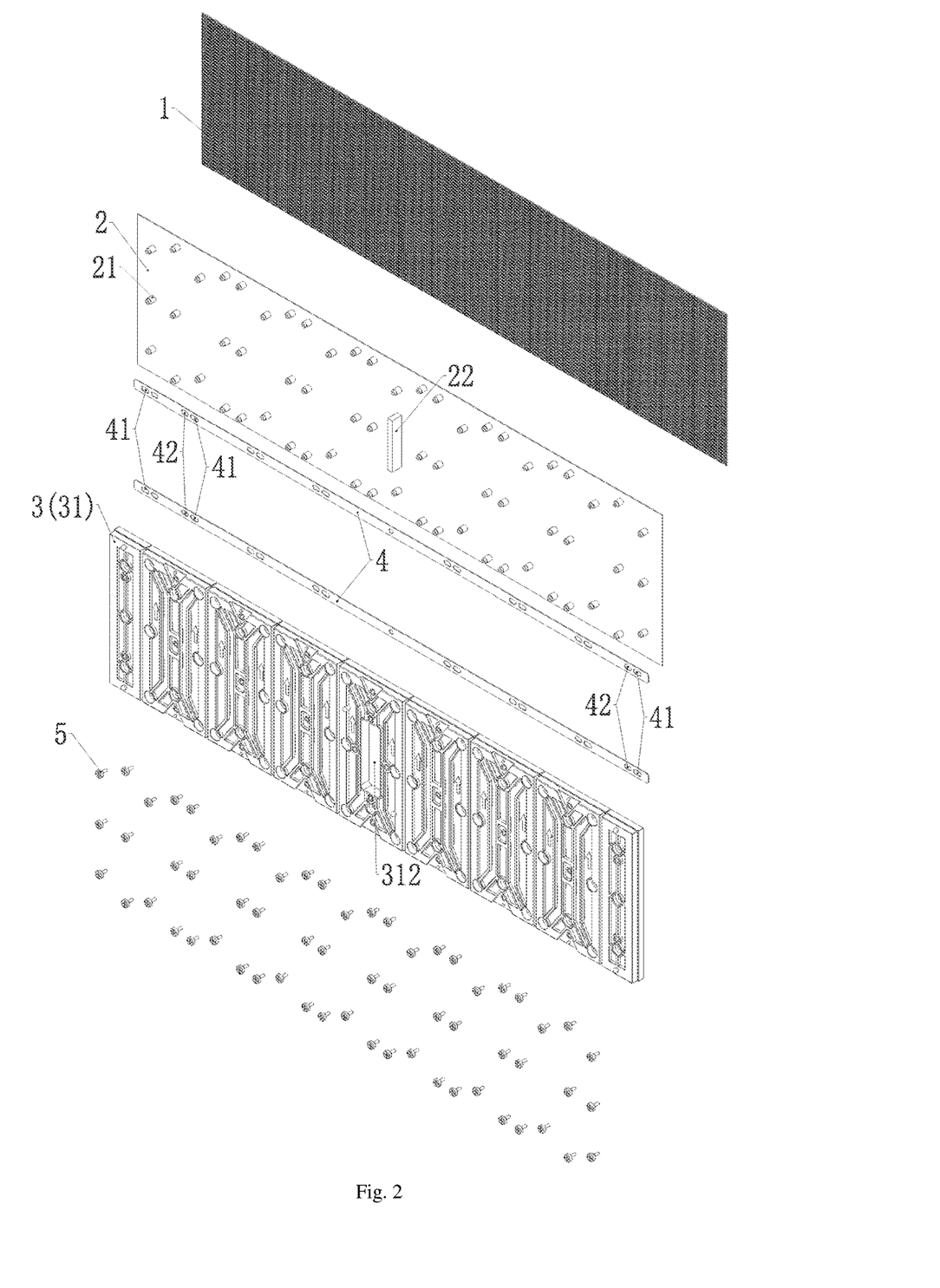
FIG. 2 is an exploded view of FIG. 1.
Figure 3:
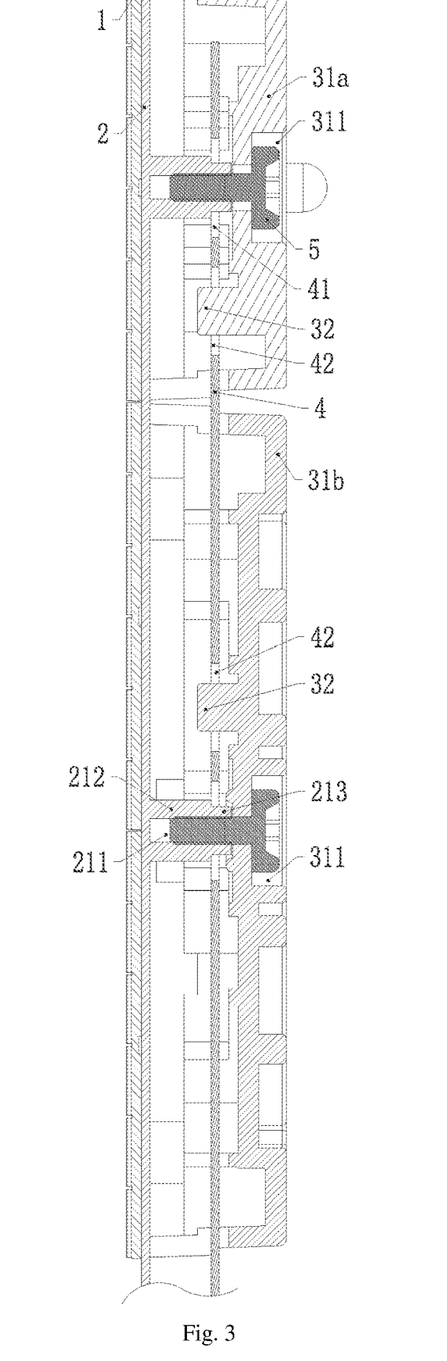
FIG. 3 is a cross-sectional view (A-A) of the rear body unit A and rear body unit B in FIG. 1.
Figure 4:
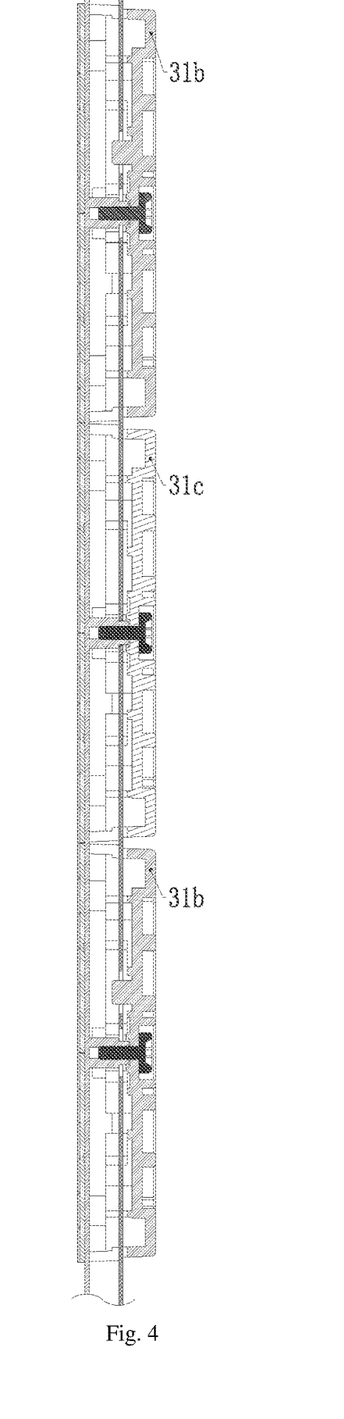
FIG. 4 is a cross-sectional view (A-A) of the rear body unit B and rear body unit C in FIG. 1.
Figure 5:
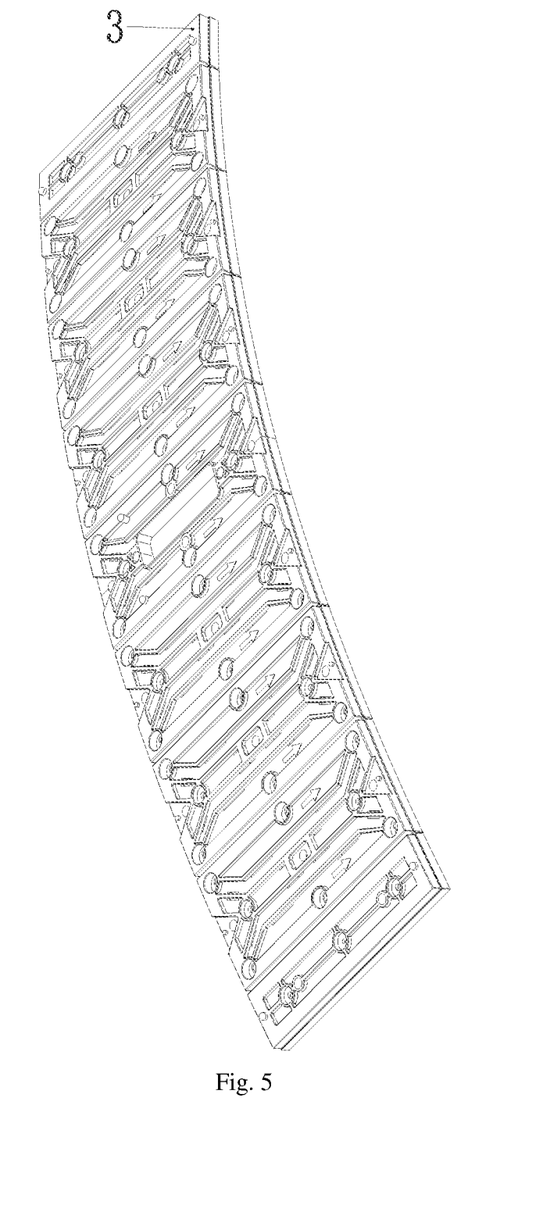
FIG. 5 is a working state diagram when the LED display unit shown in FIG. 1 is bent inward into an arc shape.
Figure 6:
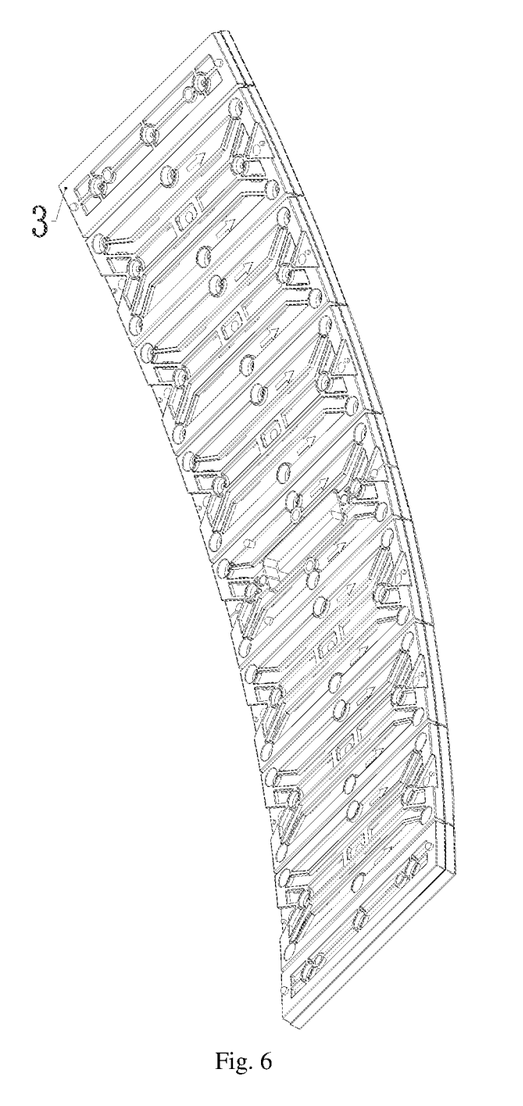
FIG. 6 is a working state diagram when the LED display unit shown in FIG. 1 is bent outward into an arc shape.
Figure 7:
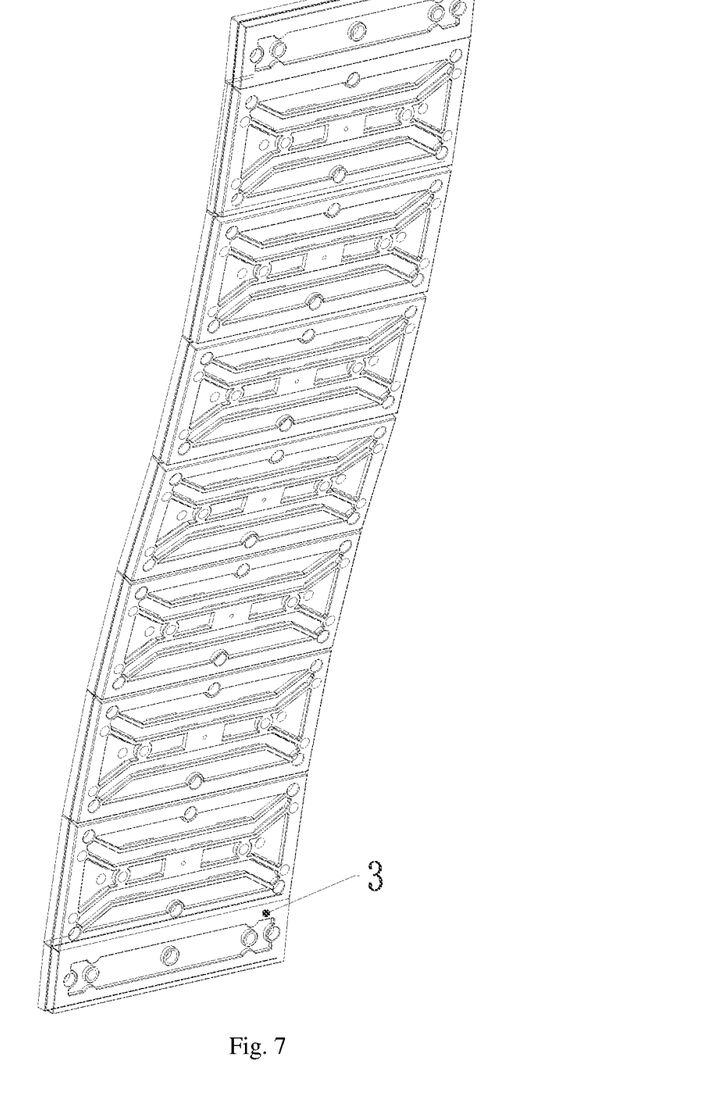
FIG. 7 is a working state diagram when the LED display unit shown in FIG. 1 is bent outward into a wave shape.

In one embodiment, as shown in FIGS. 2-4, it further includes an elastic stop piece 4 for limiting the ultimate bending degree of the lamp plate 2, and the elastic stop piece 4 is positioned between the lamp plate 2 and the rear body 3; Limiting the ultimate bending degree of the LED display unit can prevent the LED display unit from being damaged due to excessive bending and prolong the service life of the LED display unit.

Specifically, the elastic stop piece 4 is set as a strip-shaped elastic piece; Material can be saved, and the ultimate bending degree of the LED display unit can be increased to adjust more curved surface shapes.

In one embodiment, as shown in FIGS. 2-4, each rear body unit 31 is equally spaced on the elastic stop piece 4; so that the stress is uniform everywhere and the service life of the LED display unit is prolonged.

In one embodiment, the side of the lamp plate 2 facing away from the LED lamps is provided with positioning posts 21, correspondingly, the rear body unit 31 is provided with positioning holes 311; the lamp plate 2 and the rear body 3 are fixedly connected through the matching of the positioning posts 21 and positioning holes 311; the positioning posts 21 and positioning holes 311 form an interference fit, the connecting structure is simple, and is convenient for disassembly, assembly and maintenance.

In one embodiment, as shown in FIGS. 2-4, the side of the lamp plate 2 facing away from the LED lamps is provided with positioning posts 21, correspondingly, the rear body unit 31 is provided with positioning holes 311; fasteners, the positioning holes 311 and the positioning posts 21 are matched to fixedly connect the lamp plate 2 and the rear body 3. The connection is more solid and reliable, is not easy to fall apart, and is convenient for disassembly, assembly and maintenance.

In one embodiment, as shown in FIGS. 2-4, the centers of the positioning posts 21 are provided with internal threaded holes 211, the fasteners are connection screws 5, the connection screws 5 pass through the positioning holes 311 and are matched with the internal threaded holes 211 to fixedly connect the lamp plate 2 and the rear body 3. The connecting structure is simple and convenient for processing and maintenance.

Specifically, the positioning holes 311 are stepped holes, the threaded portion of the connection screw 5 is matched with the small end of the stepped hole, and the head of the connection screw 5 is positioned in the stepped hole. It can prevent the connection screw 5 from protruding out of the rear body 3, causing wear and loosening. At the same time, it can play a waterproof role.

In one embodiment, the outer surfaces of the positioning posts 21 are provided with external threads, the fasteners are nuts, the positioning posts 21 pass through the positioning holes 311 and are matched with the nuts to fixedly connect the lamp plate 2 and the rear body 3. The connecting structure is simple and convenient for processing and maintenance.

Specifically, the positioning holes 311 are stepped holes, the threaded portion of the positioning post 21 is matched with the small end of the stepped hole, and the nut is positioned in the stepped hole. It can prevent the nut from protruding out of the rear body 3, causing wear and loosening. At the same time, it can play a waterproof role.

In one embodiment, as shown in FIG. 2, the positioning post is set to be multiple and distributed in rows. The layout of lamp plate 2 is reasonably planned to facilitate processing and installation.

Specifically, the plurality of positioning posts 21 are distributed in five rows, two elastic stop pieces 4 are provided, and the two elastic stop pieces 4 are respectively sleeved on the second row and the fourth row of positioning posts 21; The ultimate bending degree of the LED display unit can be well limited.

In one embodiment, as shown in FIGS. 2-4, the positioning post is a cylinder 21, the end close to the lamp plate is a front end 212, and the other end is a rear end 213; the diameter of the front end 212 is larger than the diameter of the rear end 213;

the elastic stop piece 4 is provided with a plurality of first through holes 41 corresponding to the rear ends 213, and the elastic stop piece 4 is sleeved on the rear end 213 through the first through hole 41. The elastic stop piece 4 could be fasten more firmly.

In one embodiment, as shown in FIGS. 2-4, the length of the first through hole 41 is greater than the left and right lengths of the rear end 213; when the LED display unit is bent, the positioning post 21 slides along the first through hole 41. When the positioning post 21 moves to the leftmost or rightmost end of the first through hole 41, the positioning post 21 cannot continue to move to the left or right. At this time, the bending of the LED display unit is at ultimate bending degree to prevent the LED display unit from excessively bending.

In one embodiment, as shown in FIGS. 2-4, the elastic stop piece 4 is provided with a second through hole 42, and the stop block 32 of the rear body 3 is inserted into the second through hole 42; when the LED display unit is bent, the stop block 32 slides along the second through hole 42, and when the stop block 32 abuts the end of the second through hole 42 in the sliding direction of the positioning post 21, the positioning post 21 abuts against the end of the first through hole 41 in the sliding direction of the positioning post 21, or the positioning post 21 does not abut against the end of the first through hole 41 in the sliding direction of the positioning post 21. In this way, the impact force received by the positioning post 21 when the LED display unit is bent to the ultimate degree can be transferred to the stop block 32, so as to prevent the positioning post 21 from falling off.

Specifically, the centerlines of the first through hole 41 and the second through hole 42 in the length direction are located in the same straight line, and the second through hole 42 is disposed near the first through hole 41; It is convenient for processing and maintenance.

In one embodiment, as shown in FIGS. 1 to 4, a plurality of the rear body units are divided into rear body unit B31b, rear body unit A31a for fixed connection with the box of the LED display screen and rear body unit C31c for fixed connection with the power box of the LED display screen, the rear body units A31a are located at the left and right ends of the rear body 3, the rear body unit C31c is located in the middle of the rear body 3, and the rear body units B31b are located between the rear body unit A31a and the rear body unit C31c. The LED display screen comprises an LED display unit, a box body and a power box, wherein the box body is fixedly connected with the rear body unit A31a, and the power box is fixedly connected with the rear body unit C31c, so that the rear body 3 is prevented from being tightly connected with the box body, reducing bend resistance of the LED display unit.

Figure 1:
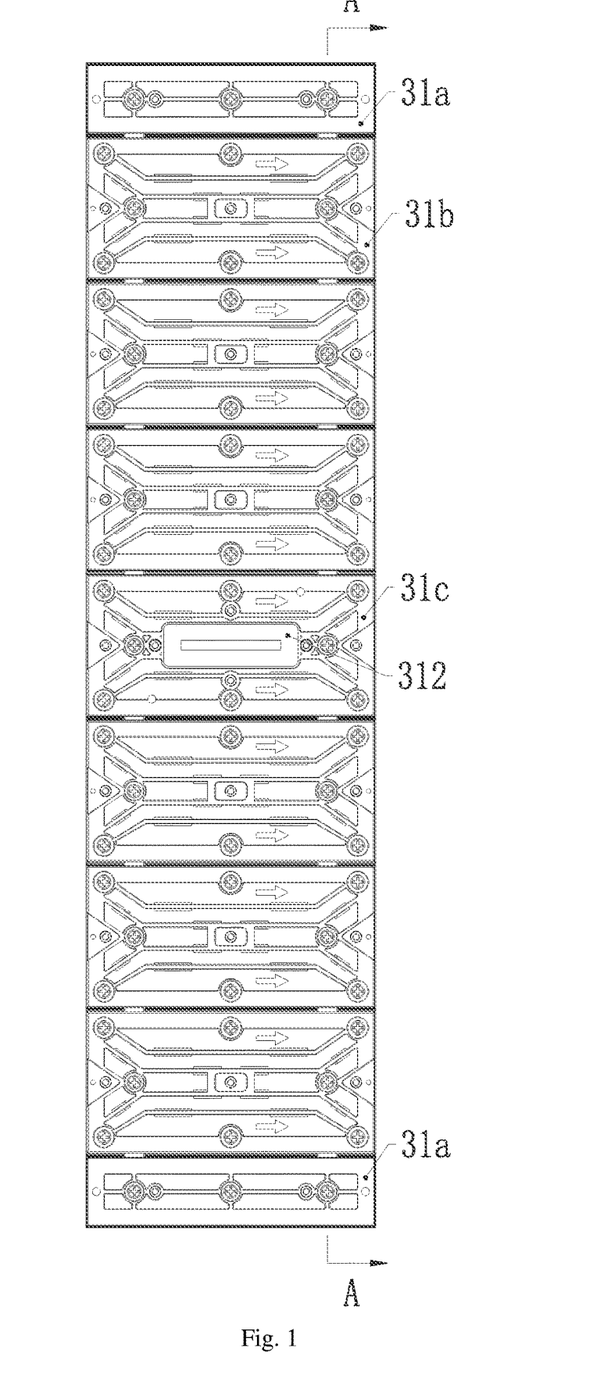
FIG. 1 is a structural schematic diagram of the LED display unit provided by an embodiment of the present application.

In one embodiment, as shown in FIGS. 1 and 2, a third through hole 312 is provided on the rear body unit C31c, a connector 22 is correspondingly provided on the lamp plate 2, and the connector 22 is inserted into the third through hole 312. External device is electrically connected with the connector 22 to control the LED display unit.

In one embodiment, as shown in FIGS. 2-4, the side of the rear body unit 31 connected to the other rear body unit 31 is set as an inclined plane, and the inclined plane is inclined from one end of the rear body unit 31 near the lamp plate 2 to one end of the rear body unit 31 facing away from the lamp plate 2. Increasing the gap between the rear body unit 31 is beneficial to release bending stress and prevent rear body 3 from breaking during bending.

Further, unless otherwise required by context, singular terms shall include pluralities and plural terms shall include the singular. Thus, as used herein and in the claims, the singular forms include the plural reference and vice versa unless the context clearly indicates otherwise. The above descriptions are only preferred embodiments of the present invention and are not intended to limit the present invention. Any modification, equivalent substitution and improvement made within the spirit and principles of the present invention shall be included within the scope of protection of the present invention.

The invention claimed is:

1. An LED display unit, comprising a front body, a lamp plate and a rear body, wherein the lamp plate is bendable and flexible, the rear body comprises a plurality of rear body units, the front body is covered on one side of the lamp plate provided with LED lamps, each of the rear body units is fixedly connected to a side of the lamp plate facing away from the LED lamps, and adjacent rear body units are arranged at intervals; and a plurality of the rear body units are divided into a rear body unit B, a rear body unit A for fixed connection with box of LED display screen and a rear body unit C for fixed connection with power box of LED display screen, the rear body units A are located at the left and right ends of the rear body, the rear body unit C is located in the middle of the rear body, and the rear body units B are located between the rear body unit A and the rear body unit C.

2. The LED display unit according to claim 1, further comprising an elastic stop piece for limiting the ultimate bending degree of the lamp plate, wherein the elastic stop piece is positioned between the lamp plate and the rear body.

3. The LED display unit according to claim 2, wherein the elastic stop piece is set as a strip-shaped elastic piece; each of the rear body unit is equally spaced on the elastic stop piece.

4. The LED display unit according to claim 2, wherein the side of the lamp plate facing away from the LED lamps is provided with positioning posts, correspondingly, the rear body unit is provided with positioning holes;

the lamp plate and the rear body are fixedly connected through the matching of the positioning posts and positioning holes, or fasteners, the positioning holes and the positioning posts are matched to fixedly connect the lamp plate and the rear body.

5. The LED display unit according to claim 4, wherein the centers of the positioning posts are provided with internal threaded holes, the fasteners are connection screws, the connection screws pass through the positioning holes and are matched with the internal threaded holes to fixedly connect the lamp plate and the rear body.

6. The LED display unit according to claim 5, wherein the positioning holes are stepped holes, the threaded portion of the connection screw is matched with the small end of the stepped hole, and the head of the connection screw is positioned in the stepped hole.

7. The LED display unit according to claim 4, wherein the outer surfaces of the positioning posts are provided with external threads, the fasteners are nuts, the positioning posts pass through the positioning holes and are matched with the nuts to fixedly connect the lamp plate and the rear body.

8. The LED display unit according to claim 7, wherein the positioning holes are stepped holes, the threaded portion of the positioning post is matched with the small end of the stepped hole, and the nut is positioned in the stepped hole.

9. The LED display unit according to claim 4, wherein the positioning post is set to be multiple and distributed in rows.

10. The LED display unit according to claim 9, wherein the positioning post is a cylinder, the end close to the lamp plate is a front end, and the other end is a rear end; the diameter of the front end is larger than the diameter of the rear end;

the elastic stop piece is provided with a plurality of first through holes corresponding to the rear ends, and the elastic stop piece is sleeved on the rear end through the first through hole.

11. The LED display unit according to claim 10, wherein the length of the first through hole is greater than the length of the rear end; when the LED display unit is bent, the positioning post slides along the first through hole.

12. The LED display unit according to claim 11, wherein the elastic stop piece is provided with a second through hole, and a stop block of the rear body is inserted into the second through hole; when the LED display unit is bent, the stop block slides along the second through hole, and when the stop block abuts the end of the second through hole in the sliding direction of the positioning post, the positioning post abuts against the end of the first through hole in the sliding direction of the positioning post, or the positioning post does not abut against the end of the first through hole in the sliding direction of the positioning post.

13. The LED display unit according to claim 1, wherein the rear body unit C is provided with a third through hole, the lamp plate is correspondingly provided with a connector for connecting a power box, and the connector is inserted into the third through hole.

14. The LED display unit according to claim 1, wherein the side of the rear body unit connected to the other rear body unit is set as an inclined plane, and the inclined plane is inclined from one end of the rear body unit near the lamp plate to one end of the rear body unit facing away from the lamp plate.

* * * * *